United States Patent
Peng et al.

(10) Patent No.: US 8,432,692 B2
(45) Date of Patent: Apr. 30, 2013

(54) SERVER CABINET WITH LIQUID COOLING SYSTEM

(75) Inventors: Wen-Tang Peng, Taipei Hsien (TW); Yi-Lang Hsiao, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 358 days.

(21) Appl. No.: 12/909,790

(22) Filed: Oct. 21, 2010

(65) Prior Publication Data

US 2012/0050984 A1   Mar. 1, 2012

(30) Foreign Application Priority Data

Aug. 24, 2010   (TW) ............................... 99128173 A

(51) Int. Cl.
*H05K 7/20*   (2006.01)
(52) U.S. Cl.
USPC ...... 361/699; 361/679.47; 361/698; 361/701; 361/702; 62/259.2
(58) Field of Classification Search .......... 361/676–678, 361/679.46–679.54, 688–693, 698–699, 361/701–704, 707, 709–710
See application file for complete search history.

(56) References Cited

U.S. PATENT DOCUMENTS

| | | | |
|---|---|---|---|
| 6,796,372 B2 * | 9/2004 | Bear | 165/104.21 |
| 7,051,802 B2 * | 5/2006 | Baer | 165/299 |
| 7,626,820 B1 * | 12/2009 | Konshak et al. | 361/700 |
| 8,305,754 B2 * | 11/2012 | Wu et al. | 361/688 |
| 2006/0193114 A1 * | 8/2006 | Faneuf et al. | 361/689 |
| 2009/0080151 A1 * | 3/2009 | Kalms et al. | 361/679.52 |
| 2009/0225514 A1 * | 9/2009 | Correa et al. | 361/701 |
| 2012/0106073 A1 * | 5/2012 | Wu et al. | 361/679.52 |

* cited by examiner

*Primary Examiner* — Courtney Smith
(74) *Attorney, Agent, or Firm* — Altis Law Group, Inc.

(57) ABSTRACT

An exemplary server cabinet includes an enclosure configured to house multiple servers therein, and a liquid cooling system. A heat conductive plate is positioned in the enclosure to be adjacent to the servers. The liquid cooling system includes a cooler located outside the enclosure, a conduit thermally connecting the cooler with the heat conductive plate, and a working liquid circulating in the conduit and the cooler. Heat generated by the servers is absorbed by the heat conductive plate and transferred to the cooler by the working liquid for dissipation.

15 Claims, 3 Drawing Sheets

SERVER CABINET WITH LIQUID COOLING SYSTEM

BACKGROUND

1. Technical Field

The disclosure generally relates to server cabinets, and more particularly to a server cabinet with a liquid cooling system.

2. Description of Related Art

For unified management, many servers can be arranged in a single cabinet. It is well known that the servers in such an arrangement may generate a considerable amount of heat during operation, particularly when they densely occupy the cabinet space. If the heat is not efficiently removed, the servers may suffer damage. Thus, heat dissipation for the cabinet is very important.

What is needed, therefore, is a server cabinet with a liquid cooling system which can overcome the described limitations.

BRIEF DESCRIPTION OF THE DRAWINGS

Many aspects of the present embodiments can be better understood with reference to the following drawings. The components in the drawings are not necessarily drawn to scale, the emphasis instead placed upon clearly illustrating the principles of the present embodiments. Moreover, in the drawings, like reference numerals designate corresponding parts throughout the various views.

DETAILED DESCRIPTION

Figure 1:
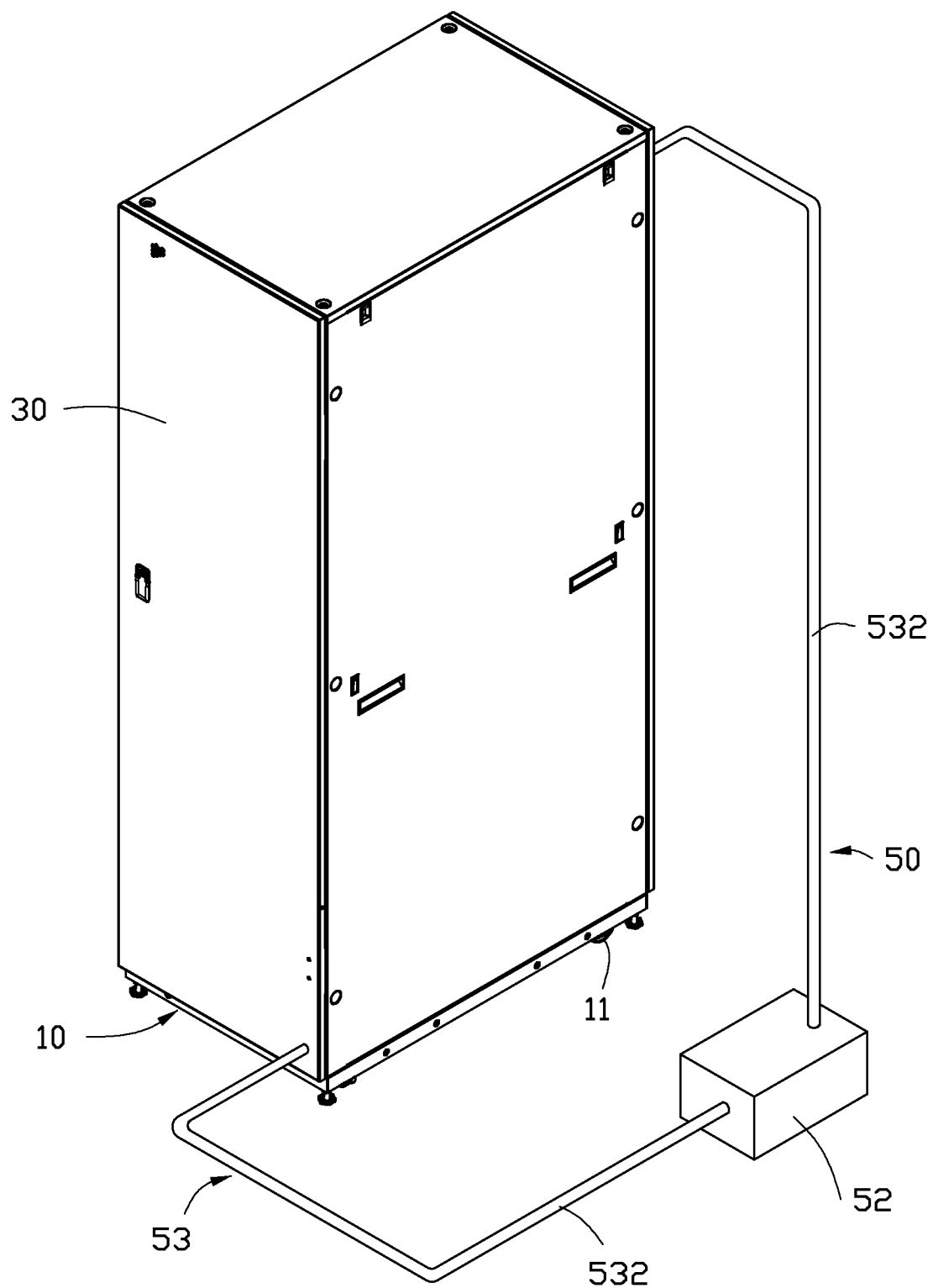
FIG. 1 is an assembled, isometric view of a server cabinet in accordance with one embodiment of the disclosure.
Figure 2:
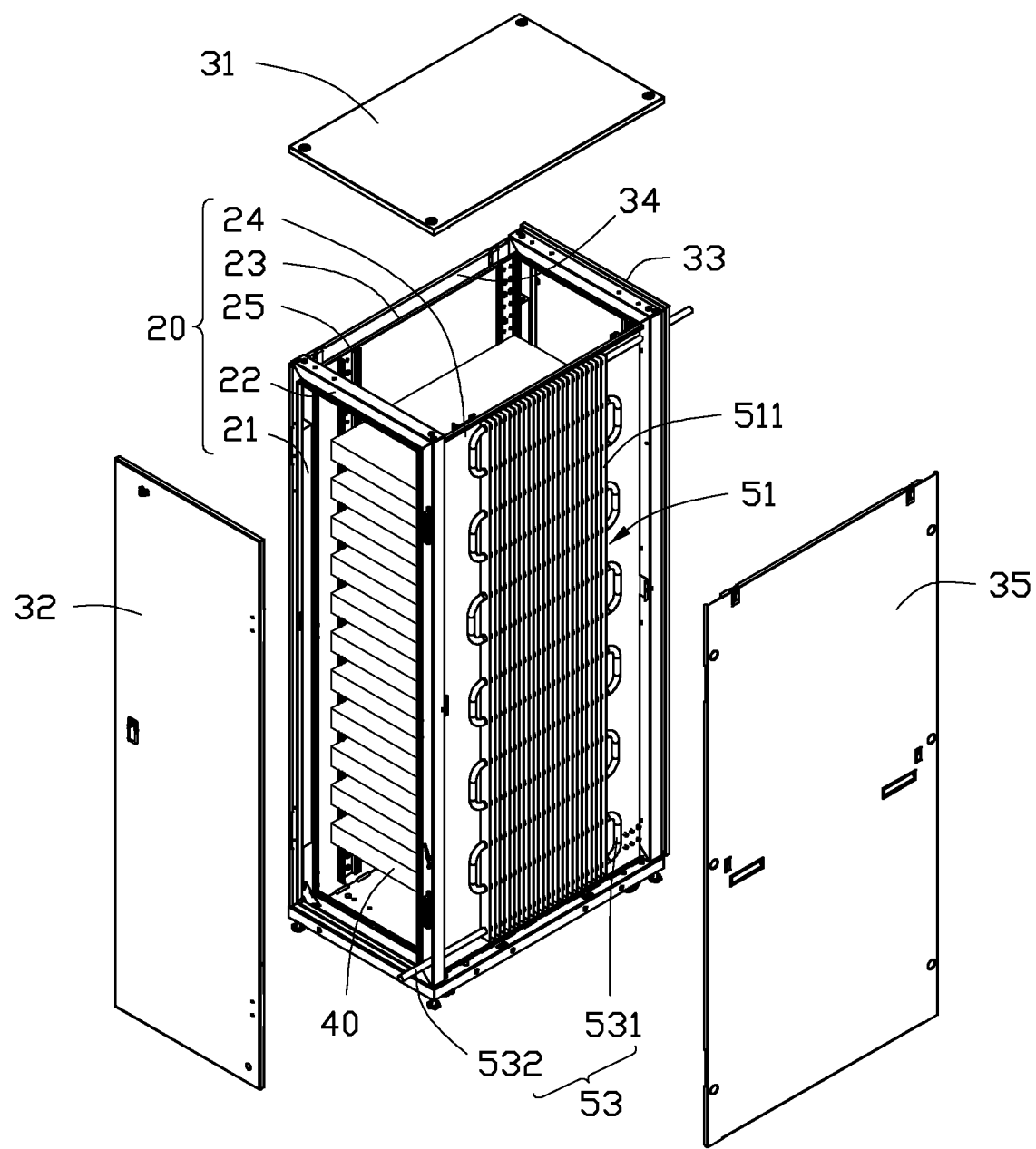
FIG. 2 is an exploded view of the server cabinet shown in FIG. 1, but with a cooler and part of a conduit of the server cabinet omitted.

Referring to FIGS. 1 and 2, a server cabinet in accordance with one embodiment of the disclosure is shown. The server cabinet includes a pedestal 10, a rack 20 located on the pedestal 10, an enclosure 30 disposed at an outer periphery of the rack 20, a plurality of servers 40 mounted on the rack 20, and a liquid cooling system 50 for dissipating heat generated by the servers 40. In the exemplary embodiment, each of the servers 40 is dimensioned such that a width of the front (and rear) of the server 40 is less than a depth of the server 40 from the front to the rear. In this description, unless the context indicates otherwise, a reference to the "front" or to the "rear" indicates a position corresponding to opposite ends of a longitudinal axis of the server cabinet; and a reference to the "left" or to the "right" indicates a position corresponding to opposite ends of a transverse axis of the server cabinet.

The pedestal 10 is substantially rectangular, and has a plurality of wheels 11 at a bottom thereof, facilitating movement of the server cabinet.

The rack 20 is mounted on the pedestal 10, and includes a plurality of vertical braces 21, a plurality of horizontal braces 22, two heat conductive plates 23, 24, and two pairs of rails 25. The vertical and horizontal braces 21, 22 cooperatively form a cubical framework. The heat conductive plates 23, 24 are located at left and right sides of the rack 20, respectively, and are fixed on the cubical framework. Each of the heat conductive plates 23, 24 is made of metal or metal alloy with a high heat conductivity coefficient, such as copper, copper-alloy, or other suitable material. The two pairs of rails 25 are symmetrically fixed on the heat conductive plates 23, 24, respectively, for mounting the servers 40 on the rack 20.

The enclosure 30 includes a top plate 31 at a top side thereof, a front plate 32 at a front side thereof, a rear plate 33 at a rear side thereof, and two side plates 34, 35 at opposite left and right sides thereof, respectively. The side plates 34, 35 are disposed outside the heat conductive plates 23, 24, respectively. Each of the side plates 34, 35 is parallel to and spaced from a corresponding heat conductive plate 23, 24. The top, front, rear, and side plates 31, 32, 33, 34, 35 and the pedestal 10 cooperatively enclose the rack 20 and the servers 40.

The liquid cooling system 50 includes a heat transfer member 51, a cooler 52, and a conduit 53 interconnecting the heat transfer member 51 and the cooler 52. The heat transfer member 51 and the conduit 53 are made of metal or metal alloy with a high heat conductivity coefficient, such as copper, copper-alloy, or other suitable material. The heat transfer member 51 includes a plurality of stacked heat transfer fins 511. The fins 511 are parallel to and spaced from each other. The fins 511 are fixed on the heat conductive plate 24 at the right side of the rack 20, and located between the heat conductive plate 24 and the side plate 35 of the enclosure 30, namely, at an interior of the enclosure 30.

The conduit 53 includes a heat transfer section 531, and two connecting sections 532 at opposite ends of the heat transfer section 531, respectively. The heat transfer section 531 curves back and forth in a zigzag shape, and extends through the fins 511, in thermal contact with the heat transfer member 51. The connecting sections 532 extend out of the enclosure 30 from a top end and a bottom end of the rack 20, respectively, and communicate with opposite sides of the cooler 52, respectively.

The cooler 52 is located at an exterior of the enclosure 30. In this embodiment, the cooler 52 is a conventional cooler, such as a thermoelectric cooler, or other. The cooler 52 and the conduit 53 contain a working liquid (not shown) therein. The working liquid usually selected is water, methanol, or alcohol, each of which has a relatively low boiling point. The working liquid contained in the heat transfer section 531 of the conduit 53 enters the cooler 52 via one of the connecting sections 532 of the conduit 53 for heat exchange, and then flows back to the heat transfer section 531 via the other connecting section 532 for further cooling circulation. A liquid pump (not shown) is provided to circulate the working liquid in the cooler 52 and the conduit 53, thereby enhancing the heat dissipation efficiency of the liquid cooling system 50.

Figure 3:
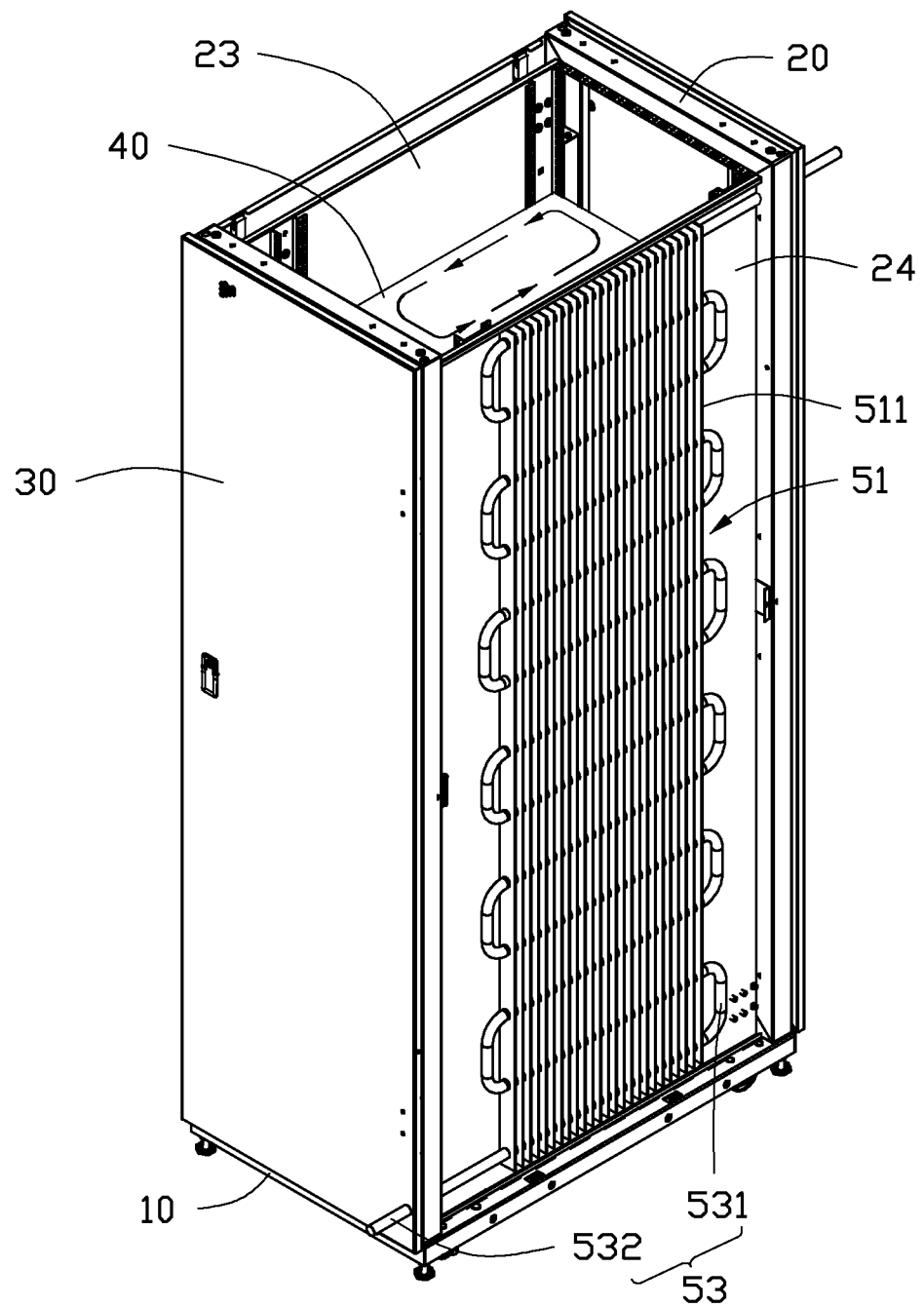
FIG. 3 is similar to FIG. 2, but with a top plate and a side plate of the server cabinet omitted, and showing air circulation in the server cabinet.

Referring to FIG. 3, during operation of the server cabinet, heat is generated by the servers 40, and thus air surrounding the servers 40 is heated. The heat conductive plate 24 absorbs the heat from the heated air, and transfers the heat to the heat transfer member 51. The heat is evacuated from the heat transfer member 51 via the working liquid contained in the conduit 53 and the cooler 52, and finally dissipates to the ambient environment via the cooler 52. In this process, the heated air at the heat conductive plate 24 is cooled to become cool air. The cool air flows toward the servers 40, and exchanges heat with the servers 40. In this way, hot and cool air circulation is generated in the enclosure 30, to evacuate the heat of the servers 40. Therefore, the heat dissipation efficiency of the server cabinet is improved. This is achieved without the need for a fan, and with minimal space being occupied by the liquid cooling system 50.

Alternatively, in the server cabinet, the heat transfer member 51 of the liquid cooling system 50 can be fixed on the heat conductive plate 23 at the left side of the rack 20, or on both of the heat conductive plates 23, 24 at the left and right sides of the rack 20.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A server cabinet comprising:
a plurality of servers;
an enclosure housing the servers therein;
a heat conductive plate positioned in the enclosure to be adjacent to the servers; and
a liquid cooling system comprising;
  a cooler located outside the enclosure;
  a conduit thermally connecting the cooler with the heat conductive plate;
  a working liquid circulating in the conduit and the cooler; and
  a heat transfer member disposed in the enclosure and thermally contacting the heat conductive plate,
  wherein the heat transfer member comprises a plurality of parallel and spaced fins, the conduit comprises a heat transfer section and two connecting sections at opposite ends of the heat transfer section, respectively, and the heat transfer section is bent back and forth to form a zigzag shape and extends through the fins, and the connecting sections communicate with opposite sides of the cooler, respectively;
wherein heat generated by the servers is absorbed by the heat conductive plate and transferred to the cooler by the working liquid for dissipation.

2. The server cabinet of claim 1, further comprising a rack on which the heat conductive plate is disposed.

3. The server cabinet of claim 2, wherein the rack further comprises a plurality of vertical braces and a plurality of horizontal braces, the vertical and horizontal braces cooperatively form a cubical framework, and the heat conductive plate is fixed on the cubical framework formed by the vertical and horizontal braces.

4. The server cabinet of claim 2, further comprising a pedestal on which the rack is located, the enclosure comprising a top plate at a top side thereof, a front plate at a front side thereof, a rear plate at a rear side thereof, and two side plates at opposite left and right sides thereof, respectively, wherein the top, front, rear, and side plates and the pedestal cooperatively enclose the rack and the servers.

5. The server cabinet of claim 4, wherein one of the side plates is disposed outside, parallel to and spaced from the heat conductive plate.

6. The server cabinet of claim 4, wherein the fins are fixed on the heat conductive plate, and located between the heat conductive plate and one of the side plates of the enclosure.

7. The server cabinet of claim 4, wherein the pedestal comprises a plurality of wheels at a bottom thereof.

8. The server cabinet of claim 2, further comprising another heat conductive plate, wherein the rack comprises two pairs of rails symmetrically fixed on the heat conductive plates, respectively, for mounting the servers on the rack.

9. A server cabinet comprising:
a plurality of servers;
an enclosure housing the servers therein;
a rack received in the enclosure and comprising a heat conductive plate positioned to be adjacent to the servers; and
a liquid cooling system comprising a heat transfer member thermally contacting the heat conductive plate, a cooler located outside the enclosure, and a conduit thermally connecting the cooler with the heat transfer member, the heat transfer member comprising a plurality of parallel and spaced fins, the conduit comprising a heat transfer section and two connecting sections at opposite ends of the heat transfer section, respectively, the heat transfer section extending through the heat transfer member, and the connecting sections extending out of the enclosure, with two ends of the conduit connected with two opposite sides of the cooler, respectively, and the heat transfer section being bent back and forth to form a zigzag shape and extending through the fins.

10. The server cabinet of claim 9, wherein the rack further comprises a plurality of vertical braces and a plurality of horizontal braces, the vertical and horizontal braces cooperatively form a cubical framework, and the heat conductive plate is fixed on the cubical framework formed by the vertical and horizontal braces.

11. The server cabinet of claim 9, further comprising a pedestal on which the rack is located, the enclosure comprising a top plate at a top side thereof, a front plate at a front side thereof, a rear plate at a rear side thereof, and two side plates at opposite left and right sides thereof, respectively, wherein the top, front, rear, and side plates and the pedestal cooperatively enclose the rack and the servers.

12. The server cabinet of claim 11, wherein one of the side plates is disposed outside, parallel to and spaced from the heat conductive plate.

13. The server cabinet of claim 11, wherein the heat transfer member is disposed between the heat conductive plate and one of the side plates of the enclosure.

14. The server cabinet of claim 9, wherein the rack further comprises another heat conductive plate and two pairs of rails symmetrically fixed on the heat conductive plates, respectively, for mounting the servers on the rack.

15. A liquid cooling system for cooling a plurality of servers of a server cabinet, the server cabinet comprising an enclosure and a heat conductive plate disposed in the enclosure, the servers disposed in the enclosure, the heat conductive plate disposed adjacent to the servers, and the liquid cooling system comprising:
a heat transfer member configured for thermally contacting the heat conductive plate;
a cooler configured as a separate piece discrete from the enclosure; and
a conduit thermally connecting the cooler with the heat transfer member, the conduit comprising a heat transfer section and two connecting sections at opposite ends of the heat transfer section, respectively, the heat transfer section extending through the heat transfer member, and the connecting sections configured for extending out of the enclosure, with two ends of the conduit connected with at least one side of the cooler, respectively;
wherein the heat transfer section is bent back and forth to form a zigzag shape; and
wherein the heat transfer member comprises a plurality of parallel and spaced fins, and the heat transfer section extends through the fins.

* * * * *